United States Patent
Kumagai (10) Patent No.: US 9,761,705 B2
(45) Date of Patent: Sep. 12, 2017

(54) WIDE BAND GAP SEMICONDUCTOR DEVICE

(71) Applicant: FUJI ELECTRIC CO., LTD., Kawasaki-shi (JP)

(72) Inventor: Naoki Kumagai, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/096,801

(22) Filed: Apr. 12, 2016

(65) Prior Publication Data

US 2016/0225894 A1    Aug. 4, 2016

Related U.S. Application Data

(62) Division of application No. 14/081,355, filed on Nov. 15, 2013, now Pat. No. 9,349,855.

(30) Foreign Application Priority Data

Nov. 29, 2012  (JP) ................................. 2012-261221

(51) Int. Cl.
*H01L 29/15*    (2006.01)
*H01L 29/78*    (2006.01)
(Continued)

(52) U.S. Cl.
CPC ...... *H01L 29/7813* (2013.01); *H01L 29/0696* (2013.01); *H01L 29/0865* (2013.01);
(Continued)

(58) Field of Classification Search
CPC ............. H01L 29/7813; H01L 29/0878; H01L 29/608; H01L 29/41766; H01L 29/1095
See application file for complete search history.

(56) References Cited

U.S. PATENT DOCUMENTS 6,342,709 B1 * 1/2002 Sugawara ........... H01L 29/0619
257/138
2006/0102953 A1    5/2006 Miura et al.
(Continued)

FOREIGN PATENT DOCUMENTS

JP    2009-266970 A    11/2009
JP    4962665 B2    6/2012

OTHER PUBLICATIONS

Masahiko Niwayama et al., "SiC Power Device and Loss-Reduction Operation" Panasonic Technical Journal vol. 57 No. 1, pp. 9-14, Apr. 2011.

*Primary Examiner* — A. Sefer
(74) *Attorney, Agent, or Firm* — Rabin & Berdo, P.C.

(57) ABSTRACT

A semiconductor device comprises an n+ type SiC semiconductor substrate, an n type low concentration drift layer of an SiC semiconductor on the substrate, p type channel regions selectively arranged in the drift layer with a specified distance between the channel regions, an n type source region selectively arranged in the channel region, a source electrode in common contact with the source region and the channel region, and a gate electrode disposed over the drift layer between two channel regions, and over a part of the channel region positioned between the drift layer and the source region intercalating a gate oxide film therebetween. The drift layer has a low concentration of at most 70% of the concentration that is required to exhibit a specified withstand voltage at a minimum ON resistance.

5 Claims, 10 Drawing Sheets

(51) Int. Cl.
  *H01L 29/10*   (2006.01)
  *H01L 29/417*  (2006.01)
  *H01L 29/08*   (2006.01)
  *H01L 29/16*   (2006.01)
  *H01L 29/06*   (2006.01)
  *H01L 29/423*  (2006.01)

(52) U.S. Cl.
  CPC ...... *H01L 29/0878* (2013.01); *H01L 29/1095* (2013.01); *H01L 29/1608* (2013.01); *H01L 29/41766* (2013.01); *H01L 29/4236* (2013.01); *H01L 29/42368* (2013.01)

(56) References Cited

U.S. PATENT DOCUMENTS

| | | |
|---|---|---|
| 2006/0267022 A1 | 11/2006 | Mizukami et al. |
| 2007/0096145 A1 | 5/2007  | Watanabe |
| 2009/0008650 A1* | 1/2009 | Mizukami ........... H01L 29/8083 257/77 |
| 2009/0072241 A1 | 3/2009 | Harris et al. |
| 2009/0134402 A1 | 5/2009 | Yatsuo et al. |
| 2009/0140327 A1* | 6/2009 | Hirao ................... H01L 29/407 257/328 |
| 2009/0200559 A1 | 8/2009 | Suzuki et al. |
| 2010/0012951 A1 | 1/2010 | Yatsuo et al. |
| 2010/0013010 A1 | 1/2010 | Akiyama et al. |
| 2010/0285647 A1 | 11/2010 | Ueno |
| 2011/0198613 A1* | 8/2011 | Shimizu .............. H01L 29/0603 257/77 |
| 2011/0291110 A1 | 12/2011 | Suzuki et al. |
| 2012/0061747 A1* | 3/2012 | Uchihara ........ H01L 21/823487 257/329 |
| 2012/0153303 A1 | 6/2012 | Uchida |
| 2013/0020587 A1 | 1/2013 | Hino et al. |
| 2013/0306983 A1 | 11/2013 | Nakano et al. |

* cited by examiner

FIG. 6B
RELATED ART $$Cdg = Cdgo \times Cdgd/(Cdgo+Cdgs)$$

FIG. 7
RELATED ART

| | FRACTION IN TOTAL ON RESISTANCE | REMARKS |
|---|---|---|
| CHANNEL RESISTANCE | ABOUT 50% | CHANNEL MOBILITY (ELECTRON MOBILITY) 20~50 $cm^2/Vs$ (4H-SiC) |
| DRIFT LAYER RESISTANCE | ABOUT 20% | BULK MOBILITY (ELECTRON MOBILITY) 650~720 $cm^2/Vs$ (4H-SiC) |
| OTHERS | ABOUT 30% | CONTACT RESISTANCE, SUBSTRATE RESISTANCE, JFET RESISTANCE, AND OTHERS |

WIDE BAND GAP SEMICONDUCTOR DEVICE

CROSS-REFERENCE TO RELATED APPLICATION

This is a divisional of U.S. application Ser. No. 14/081,355, filed on Nov. 15, 2013. This application is based on, and claims priority to, Japanese Patent Application No. 2012-261221, filed on Nov. 29, 2012, the contents of which are incorporated herein by reference.

BACKGROUND OF THE INVENTION

1. Field of the Invention

The present invention relates to a wide band gap semiconductor device used in inverters, switching power supplies, and other power devices, in particular to wide band gap semiconductor devices for switching operation at high frequencies.

2. Description of the Related Art

Wide band gap semiconductors including silicon carbide (SiC) semiconductor (hereinafter also referred to as "SiC"), gallium nitride (GaN) semiconductor (hereinafter also referred to as "GaN"), and diamond are expected for application to power devices owing to their excellent properties such as high breakdown electric field strength and high thermal conductivity.

Figure 4:
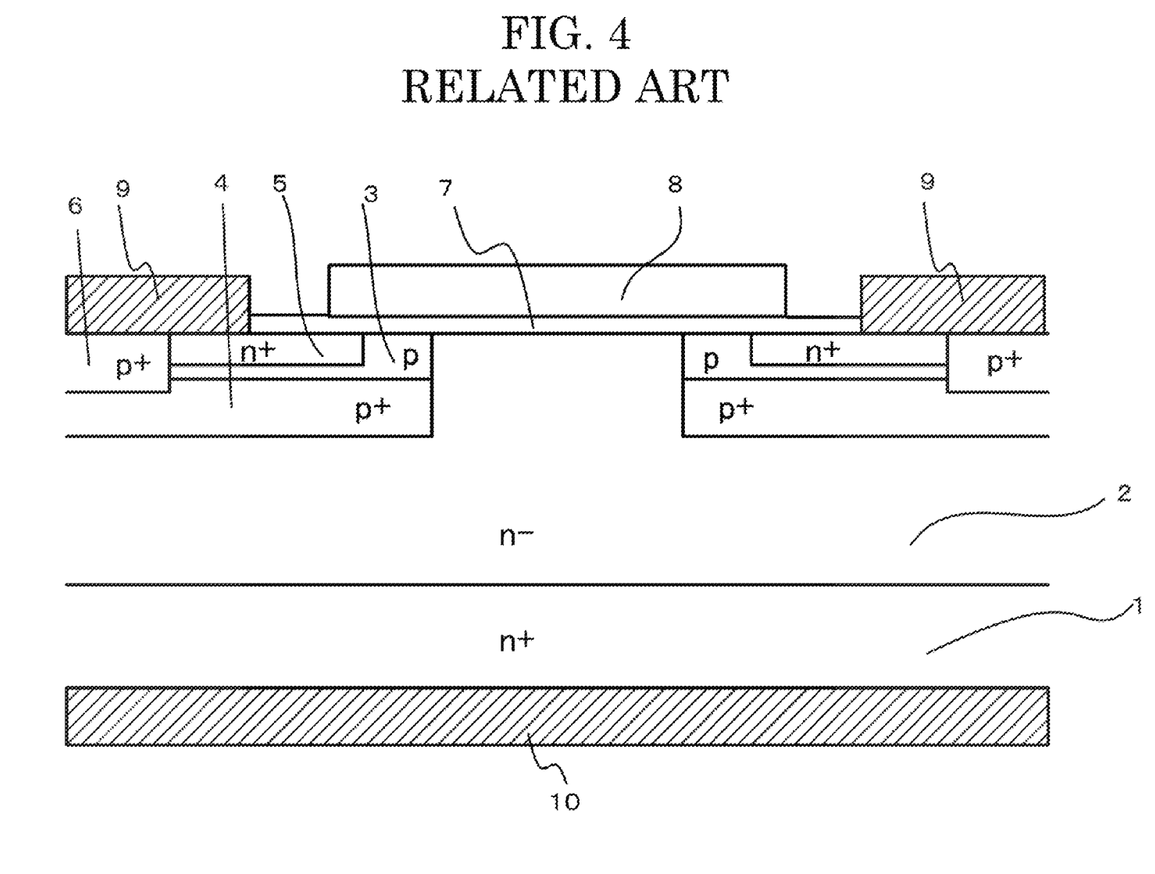
FIG. 4 is a schematic sectional view of a part of an SiC vertical power MOSFET according to a conventional technology.

FIG. 4 is a schematic sectional view of a part of a vertical power MOSFET of SiC according to a conventional technology. This SiC vertical power MOSFET has a low impurity concentration n type drift layer 2 (hereinafter "low impurity concentration" is simply referred to as "low concentration") deposited by epitaxial growth on a high concentration n type semiconductor substrate 1. A plurality of p channel regions 3 is selectively disposed in parts of the surface region of the low concentration n type drift layer 2. Under the p channel region 3, a high concentration p base region 4 is provided to prevent the p channel region 3 from punching through when the pn junction between the p channel region 3 and the low concentration n type drift layer 2 is subjected to a high reverse bias voltage. In parts of the surface region of the p channel region 3 are disposed an n+ source region 5 and a p+ contact region 6 for connecting the high concentration p base region 4 with a source electrode 9, which is mentioned below, with low resistance. A gate electrode 8 of conductive poly-silicon covers the surface region of the low concentration n type drift layer 2 and the p channel regions 3 between the n+ source region 5 and the surface region of the n− drift layer 2. The gate oxide film 7 is intercalated beneath the gate electrode 8. The source electrode 9 is in contact with the surfaces of the n+ source region 5 and the p+ contact region 6. A drain electrode 10 is in contact with the other surface of the high concentration n type semiconductor substrate 1. An interlayer dielectric film (not shown in the figure) is provided between the poly-silicon gate electrode 8 and the source electrode 9.

The following describes a basic operation of the SiC vertical power MOSFET of FIG. 4. When a voltage over a threshold value is applied onto the poly-silicon gate electrode 8 with respect to the source electrode 8, an inversion layer is formed in the surface region of the p channel region 3 right under the poly-silicon gate electrode 8. If a positive voltage is applied onto the drain electrode 10 with respect to the source electrode 9 under this condition, an electron pathway is formed consisting of: source electrode 9—n+ source region 5—the inversion layer in the surface region of the p channel region 3—the n− type drift layer 2—the high concentration n type semiconductor substrate 1—the drain electrode 10. As a result, an electric current flows from the drain electrode 10 to the source electrode 9, which is an ON state. If the voltage applied to the poly-silicon gate electrode 8 is lower than the threshold value with respect to the source electrode 9, the inversion layer disappears and the current does not flow, which is an OFF state. This basic operation does not differ from usual MOSFETs of silicon semiconductor (simply referred to as "Si"). However, the wide band gap semiconductors exhibit a material property of higher breakdown electric field strength than that of Si: 10 times as high for 4H—SiC, 11 times as high for GaN, and 19 times as high for diamond as the Si. As a consequence, a low concentration n type drift layer 2 of a wide band gap semiconductor can have a high impurity concentration and a small thickness as compared with a Si device. In other words, a high withstand voltage and a low ON state resistance can be achieved.

Figure 5:
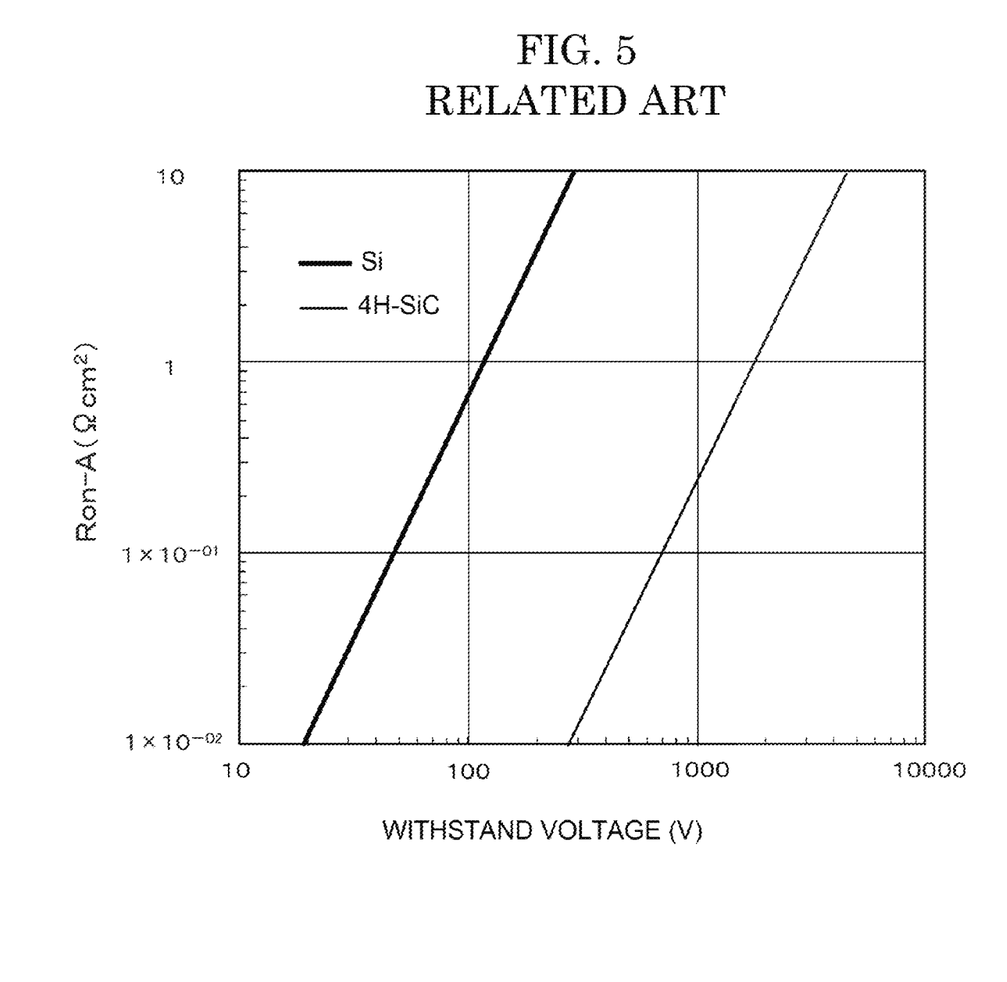
FIG. 5 shows a relationship between withstand voltage and the minimum value of ON state resistivity for a unit area in Si devices and SiC devices.

FIG. 5 shows a relationship between withstand voltage and minimum ON state resistance in comparison between the Si and 4H—SiC, in which the abscissa represents the withstand voltage and the ordinate represents ON resistivity for unit area (1 $cm^2$). Thus, FIG. 5 shows a relationship between the withstand voltage and the theoretically minimum ON state resistance of a MOSFET disregarding channel resistance and contact resistance with electrodes. These relationships are generally referred to as Si limit and SiC limit. FIG. 5 shows that the ON resistivity is proportional to the 2.5th power of the withstand voltage. The concentration and thickness of a drift layer of an SiC-MOSFET are usually designed at the values corresponding to the minimum resistivity value. For example, an SiC drift layer of a device that requires a withstand voltage of 1,200 V in consideration of some tolerance is designed with a concentration of $1.3 \times 10^{16}$ $cm^{-3}$ and a thickness of about 10 μm, and an SiC drift layer of a device that requires a withstand voltage of 1,700 V is designed with a concentration of $8 \times 10^{15}$ $cm^{-3}$ and a thickness of about 12 μm. FIG. 5 shows that an ON resistivity of 4H—SiC is theoretically about 1/1,000 of that of Si at the same withstand voltage. This is based on the fact that the breakdown electric field strength of SiC is ten times that of Si. This means, under a theoretical ultimate condition, that an SiC device, as compared with a Si device, can have a concentration in drift layer thereof of about 100 times and a thickness of about 1/10.

Some documents are known to disclose the impurity concentration of a drift layer of a vertical SiC-MOSFET. Patent Document 1 (identified further on) discloses that a drift layer epitaxially grown on an SiC semiconductor substrate in an SiC semiconductor device of a MOSFET for withstand voltage of 1,400 V preferably has a high resistivity such as would be attained by doping an n type impurity, for example nitrogen, at a concentration in the range from $1 \times 10^{15}$ $cm^{-3}$ to $1 \times 10^{16}$ $cm^{-3}$. Patent Document 2 (identified further on) discloses a method of manufacturing an n type channel SiC MOSFET in which an SiC drift layer is epitaxially grown on the surface of an n type low resistivity SiC semiconductor substrate. This drift layer has an n type impurity concentration in the range from $1 \times 10^{13}$ $cm^{-3}$ to $1 \times 10^{18}$ $cm^{-3}$ obtained by means of CVD and has a thickness in the range from 4 μm to 200 μm.

[Patent Document 1]
  Japanese Unexamined Patent Application Publication No. 2009-266970 (paragraph 0035 in particular)

[Patent Document 2]

Japanese Patent No. 4962665 (paragraph 0029 in particular)

As described previously, one of the advantages of wide band gap semiconductors is that the breakdown electric field strength thereof is higher than that of Si. Consequently, a device with a higher withstand voltage can be designed as compared with the Si device by raising the concentration of the drift layer, which means lower resistivity and restricted extension of a depletion layer. Thus, a thickness that is required for ensuring a specified withstand voltage can be reduced, which further reduces the resistance of the drift layer. The enhanced concentration and limited extension of the depletion layer in the drift layer, however, increase a junction capacitance, which can impose another problem.

Figure 6A:
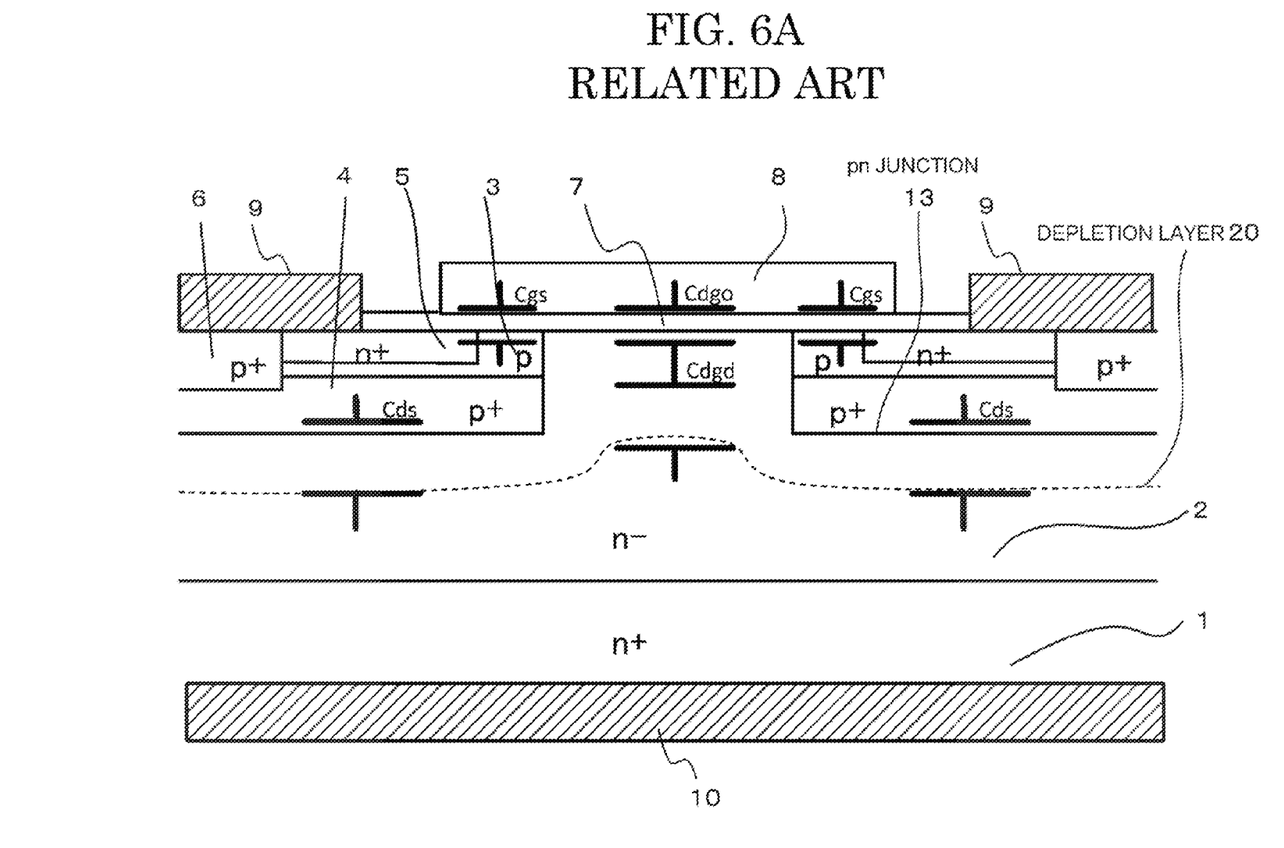
FIG. 6A is a schematic sectional view of a part of an SiC vertical power MOSFET indicating distribution of capacitances.
Figure 6B:
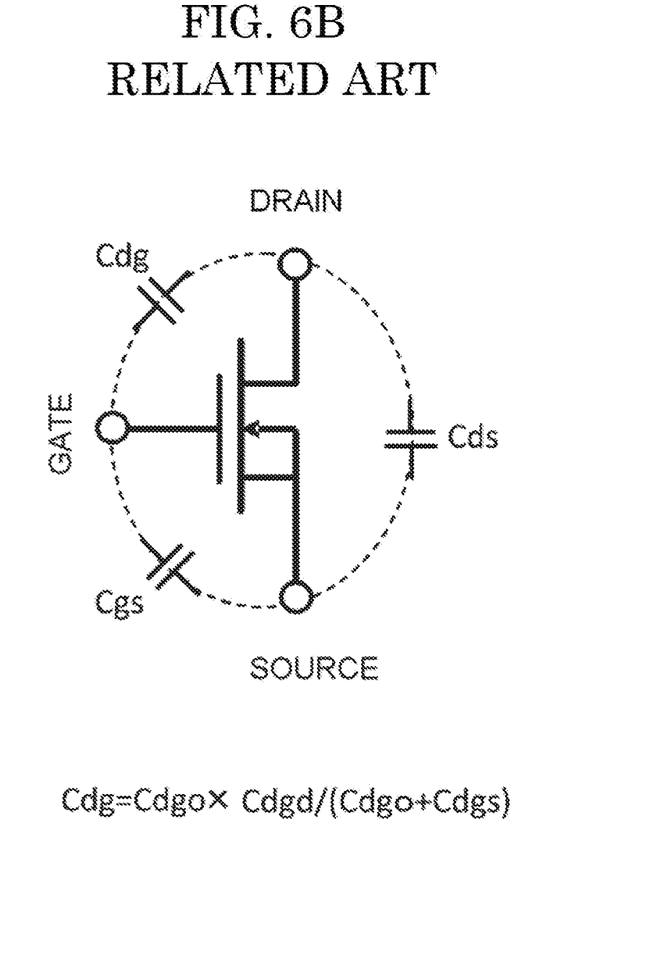
FIG. 6B shows an equivalent circuit of the MOSFET of FIG. 6A.

FIG. 6A is a sectional view of a part of an SiC MOSFET indicating distribution of capacitances including the capacitances within the semiconductor substrate of the MOSFET. FIG. 6B shows an equivalent circuit of the MOSFET with the capacitances. The broken line drawn in the semiconductor substrate of the SiC MOSFET of FIG. 6A indicates the front of the depletion layer 20 extending from the pn junction 13 into the low concentration n type drift layer 2 when a positive voltage is applied onto the drain electrode 10 with respect to the source electrode 9 in an OFF state. The figure omits a depletion layer that extends into the p channel region 3 and the high concentration p base region 4. The capacitances Cds and Cdgd of the depletion layer are larger in the SiC-MOSFET than those in a Si-MOSFET that exhibits the same withstand voltage. In FIG. 6A, the symbol Cds designates a drain-source junction capacitance and the symbol Cdgd designates a drain-gate capacitance in the depletion layer; the capacitances are also referred to simply as Cds and Cdgd. Thus, the Cds and the Cdg in the equivalent circuit of FIG. 6B are larger than those in the Si device. Here, Cdg=Cdgo×Cdgd/(Cdgo+Cdgd). An output capacitance Coss is the sum of the Cds and the Cdg. The electric charges stored in the output capacitance Coss at a high voltage in the OFF state are discharged in the ON state, causing energy low $(\frac{1}{2})CV^2$ due to the junction capacitance. Because of voltage dependency of the capacitance C, the actual energy loss is $(\frac{1}{2})\int C(V) \, V^2 \, dV$. This energy loss becomes large at high switching frequencies in particular, restricting the upper limit of operation frequency of the device. Variation in the drain voltage due to the large Cdg is fed back to the gate voltage which in turn may generate an oscillation phenomenon. In order to cope with this problem, it would be effective to add an external capacitance element to increase the input capacitance Cgs for mitigating the influence of the feedback due to the Cdg. The increase in the input capacitance, however, causes an enlarged driver circuit and increased driving loss in high speed driving in particular.

SUMMARY OF THE INVENTION

The present invention has been made in view of the above-described problems and an object of the present invention is to provide a wide band gap semiconductor device that generates less switching loss involved in the capacitances, and in which negligible variation of the drain voltage due to the drain-source capacitance Cds feeds back to the gate voltage, to prevent an oscillation phenomenon.

In order to achieve the object, a wide band gap semiconductor device comprises a wide band gap semiconductor substrate of a first conductivity type with a high impurity concentration, a drift layer of the first conductivity type with a low impurity concentration composed of a wide band gap semiconductor material on the substrate, a plurality of channel regions of a second conductivity type selectively arranged in a surface region of the drift layer with a specified distance between the channel regions, a source region of the first conductivity type selectively arranged in a surface region of the channel region of the second conductivity type, a source electrode in common contact with a surface of the source region and a surface of the channel region, and a gate electrode disposed over a surface of the surface region of the drift layer positioned between the channel regions and over surfaces of the channel regions each positioned between the surface region of the drift layer and the source region, intercalating a gate oxide film beneath the gate electrode.

The drift layer of the first conductivity type with a low impurity concentration composed of a wide band gap semiconductor material has a low impurity concentration not higher than 70% of an impurity concentration that is required to exhibit a specified withstand voltage at a minimum ON resistance.

The drift layer of the first conductivity type with a low impurity concentration may be composed of a wide band gap semiconductor material having a low impurity concentration not higher than 50% of the impurity concentration that is required to exhibit a specified withstand voltage at a minimum ON resistance.

The drift layer of the first conductivity type with a low impurity concentration may be composed of a wide band gap semiconductor material having a low impurity concentration of at least 25% of the impurity concentration that is required to exhibit a specified withstand voltage at a minimum ON resistance.

An impurity concentration in the surface region of the drift layer positioned between the channel regions may be higher than an impurity concentration in another portion of the drift layer.

A thickness of a part of the gate oxide film that is in contact with the surface region of the drift layer positioned between the channel regions may be thicker than a thickness of a part of the gate oxide film that is in contact with a surface of the channel region positioned between the surface region of the drift layer and the source region.

The wide band gap semiconductor material may be selected from the group consisting of silicon carbide (SiC) semiconductor, gallium nitride (GaN) semiconductor, and diamond.

In another aspect of the present invention, a wide band gap semiconductor device comprises a wide band gap semiconductor substrate of a first conductivity type with a high impurity concentration, a drift layer of the first conductivity type with a low impurity concentration composed of a wide band gap semiconductor material on the substrate, a channel region of a second conductivity type selectively formed in a surface region of the drift layer, a source region of the first conductivity type selectively arranged in a surface region of the channel region of the second conductivity type, a source electrode in common contact with a surface of the source region and a surface of the channel region, a plurality of gate trenches formed from a surface of the source region of the first conductivity type through the channel region reaching the drift layer, and a gate electrode embedded in each of the gate trenches interposing a gate oxide film on an inner surface of the gate trench.

An impurity concentration of the drift layer of the first conductivity type with a low impurity concentration composed of a wide band gap semiconductor material is in a range from 33% to 60% of an impurity concentration that is required to exhibit a specified withstand voltage at a minimum ON resistance.

The gate oxide film may be thicker on a bottom of the trench than on a side wall of the trench.

In a still another aspect of the present invention a wide band gap semiconductor device comprises a wide band gap semiconductor substrate of a first conductivity type with a high impurity concentration, a drift layer of the first conductivity type with a low impurity concentration composed of a wide band gap semiconductor material on the substrate, a channel region of a second conductivity type selectively formed in a surface region of the drift layer, a source region of the first conductivity type selectively arranged in a surface region of the channel region of the second conductivity type, a source electrode in common contact with a surface of the source region and a surface of the channel region, a plurality of gate trenches and a plurality of source trenches, each of the gate trenches and the source trenches being formed from a surface of the source region of the first conductivity type through the channel region reaching the drift layer and being arranged alternately, a gate electrode embedded in each of the gate trenches interposing a gate oxide film on an inner surface of the gate trench, and a base region of the second conductivity type with a high impurity concentration disposed at a bottom of each of the source trenches.

The source electrode that is in contact with the base region and the source region both exposing to a side wall of the source trench is embedded in the source trench, and an impurity concentration of the drift layer of the first conductivity type with a low impurity concentration composed of a wide band gap semiconductor material is in a range from 33% to 60% of an impurity concentration that is required to exhibit a specified withstand voltage at a minimum ON resistance.

The wide band gap semiconductor material may be selected from the group consisting of silicon carbide (SiC) semiconductor, gallium nitride (GaN) semiconductor, and diamond.

The present invention as described above provides a wide band gap semiconductor device that generates less switching loss involved in the capacitances, and negligible variation of the drain voltage due to the drain-source junction capacitance Cds feeds back to the gate voltage, to prevent an oscillation phenomenon.

DETAILED DESCRIPTION OF THE INVENTION

The following describes details wide band gap semiconductor devices according to some preferred embodiments of the invention with reference to accompanying drawings. In the following description of Embodiment Examples, the wide band gap semiconductor devices are SiC vertical power MOSFETs. The present invention, however, is not limited to that type of semiconductor devices. In the specification and accompanying drawings, the regions and layers prefixed by "n" or "p" contain the majority carriers of electrons or holes, respectively. The symbol "+" or "−" added to the "n" and "p" means relatively high or low impurity concentration in the region or layer. In the specification and the drawings, the similar structures are given the same symbols and repeated description thereon is avoided. The drawings are not depicted in correct scales for the purpose of better understanding.

Embodiment Example 1

Figure 1:
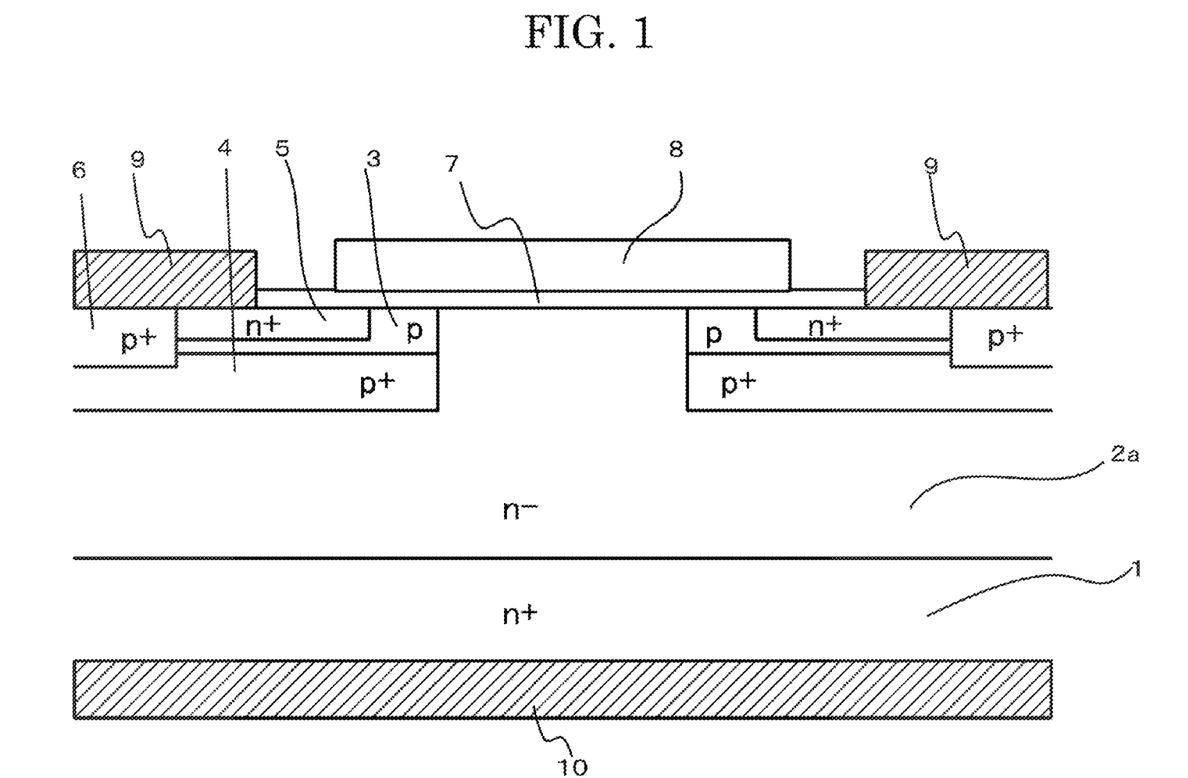
FIG. 1 is a schematic sectional view of a part of an SiC vertical power MOSFET according to Embodiment Example 1 of the present invention.

FIG. 1 is a schematic sectional view of a part of an SiC vertical power MOSFET according to Embodiment Example 1 of the present invention. The SiC vertical power MOSFET of FIG. 1 differs from that of FIG. 4 in that the low concentration n type drift layer 2 is replaced by a low concentration n type drift layer 2a that has a concentration at most 70%, or in some embodiments at most 50%, of the "best concentration" that achieves a specified withstand voltage and the minimum ON state resistivity and is considered the most preferable. One possible concentration is, for example, $1.3 \times 10^{16}$ cm$^{-3}$ for a SiC device of a withstand voltage of 1,200 V.

Figure 7:
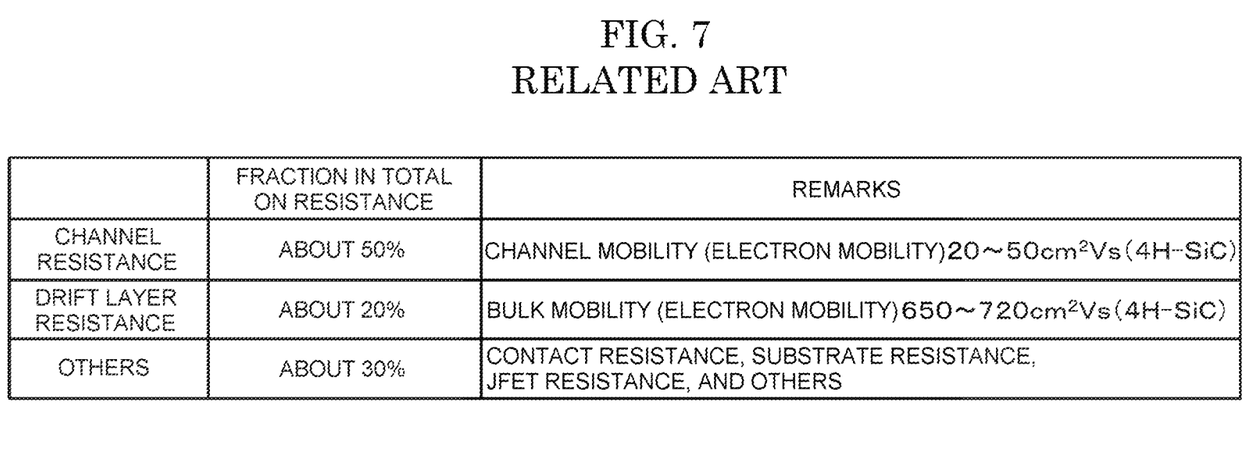
FIG. 7 is a table showing the items of resistance components composing the ON state resistance of an SiC vertical power MOSFET.

FIG. 7 is a table showing the items of resistance components composing the ON state resistance in the conventional SiC vertical power MOSFET of FIG. 4. The items of resistance components are classified corresponding to the current paths of a channel region, a drift layer, and other regions, and contributions of each item is given in the table. In an SiC vertical power MOSFET, the electron mobility in the inversion layer of the channel region, channel mobility, is remarkably smaller than the electron mobility in the bulk drift layer, bulk mobility. Large electron mobility means a small ON state resistivity, and the resistance in the drift layer 2 in the SiC device accounts for only 20% of the total resistance. Even if the resistance of the drift layer is doubled by decreasing the concentration of the drift layer down to 50% of the best concentration, the total ON state resistance does not become twice but is held within 20% increase. Nevertheless, the concentration of the drift layer should not be increased too much because the ON resistance increases significantly. If the concentration of the drift layer is decreased down to 25% of the best concentration, the resistance of the drift layer increases to four times, and the total ON resistance increases by 60%, causing a bad effect. Thus, in non-limiting embodiments the concentration of the drift layer in a device of the invention is not decreased to less than 25% of the best concentration. An SiC MOSFET is generally used with a Schottky barrier diode composed of the same wide band gap semiconductor. In an actual embodiment comprising an SiC MOSFET and a Schottky barrier diode of the SiC, the ratio of losses changes depending on the operating frequency between the switching loss including a loss due to junction capacitances in the MOSFET and the diode and the loss due to the ON state resistance. Thus, the optimum concentration of the drift layer is decided at a value in the concentration range from 25% to 70%, and in some embodiments from 25% to 50% of the best concentration, which is $1.3 \times 10^{16}$ cm$^{-3}$ for a withstand voltage of 1,200 V, for example.

In addition to reduction of the concentration of the drift layer 2a, the thickness of the drift layer 2a can actually be reduced as well. Because the electron mobility increases to some extent, the increase in the ON state resistance can be made a little smaller than the calculation mentioned earlier. However, reduction in the thickness of the drift layer causes reach-through at a relatively low voltage and abruptly suppresses extension of a depletion layer just beyond the interface between the drift layer and the high density n type substrate. Thus, reduction in the junction capacitance at a high voltage is suppressed. But the junction capacitance is sufficiently decreased until the punch-through voltage, and nearly in a saturated state. Therefore, this effect is negligible.

In the Embodiment Example 1, a concentration is selected in the range lower than the best concentration with only a little increase in the ON state resistance. This reduction of the concentration results in significant decrease in the Cds and Cdg, which in turn significantly reduces the output capacitance Coss, which is the sum Cds+Cdg. When the concentration of the drift layer 2a is reduced to 50% of the best concentration, for example, the output capacitance Coss can be halved whereas the increase in the ON state resistance is only 20% as described previously. In addition, the depression layer capacitance Cdgd (indicated in FIG. 6A) under the gate oxide film 7 beneath the polysilicon gate electrode 8 decreases, resulting in reduction in the drain-gate capacitance Cdg. Therefore, the oscillation phenomenon that is caused by feedback of drain voltage variation to gate voltage is suppressed. Here, Cdg=Cdgo×Cdgd/(Cdgo+Cdgd).

A MOSFET with a withstand voltage higher than 1,200 V has a thicker drift layer corresponding to the higher withstand voltage, increasing the resistance of the drift layer because of thicker drift layer and lower doping concentration corresponding to the increased withstand voltage. But a cell pitch of the MOSFET may be larger because of a stronger JFET effect due to lower doping concentration. The larger cell pitch increases channel resistance.

The ON resistance of a MOSFET with a high withstand voltage of 1,700 V, for example, is certainly larger in the contribution from the drift layer to some extent as compared with a device with a withstand voltage of 1,200 V. But the contribution from the drift layer of the high withstand voltage device differs only little from that of a device with a withstand voltage of 1,200 V. Therefore, the high withstand voltage MOSFET is expected to have a similar capacitance reduction effect as a MOSFET with a withstand voltage of 1,200 V.

Embodiment Example 2

Figure 2:
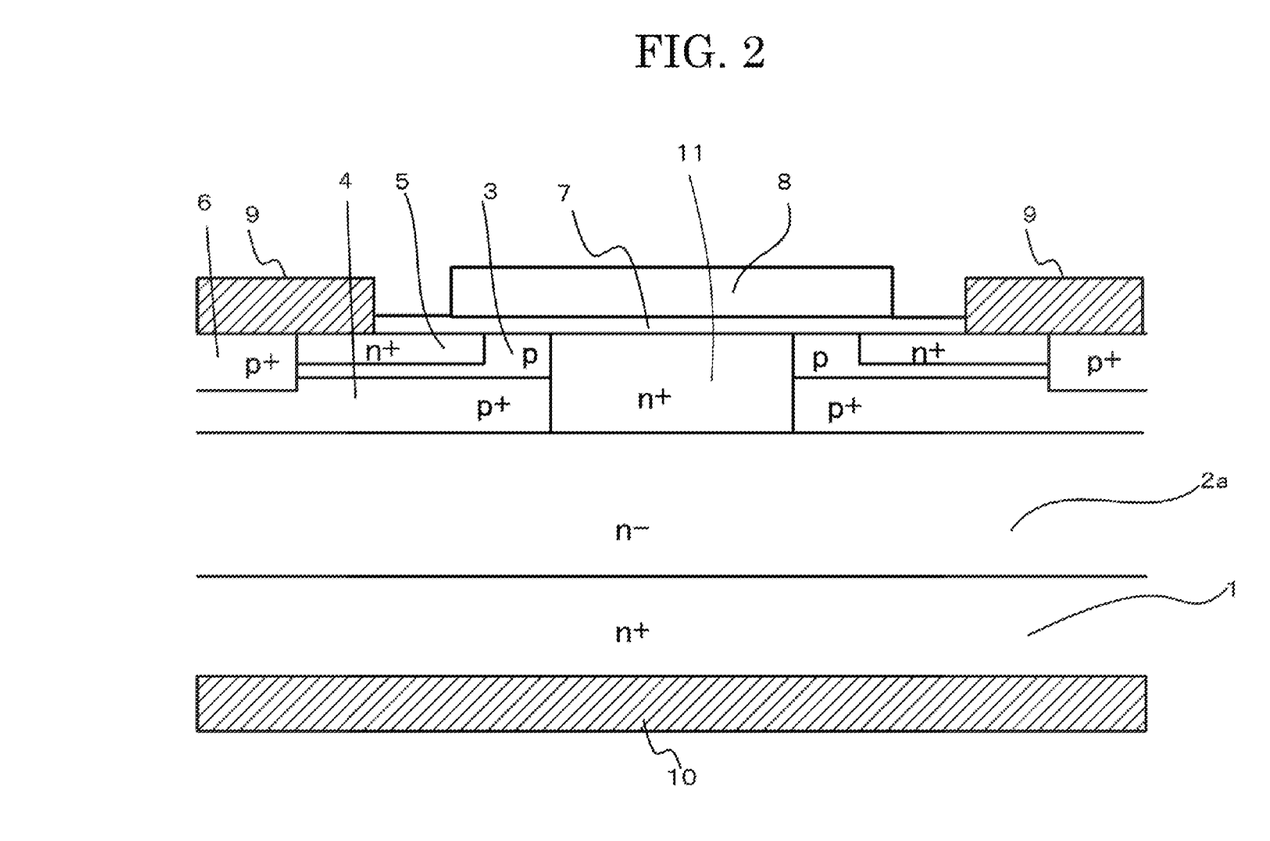
FIG. 2 is a schematic sectional view of a part of an SiC vertical power MOSFET according to Embodiment Example 2 of the present invention.

FIG. 2 is a sectional view of a part of an SiC vertical power MOSFET according to Embodiment Example 2 of the present invention. The SiC vertical power MOSFET of FIG. 2 differs from the device of Embodiment Example 1 shown in FIG. 1 in that the surface region of the low concentration n type drift layer 2a between a layer including the p channel region 3 and the high concentration p base region 4 and another layer opposing the former layer and having a similar construction is replaced by an n type region 11 with a concentration higher than that of the low concentration n type drift layer 2a. The high concentration n type region 11 is expected to reduce the resistance that is caused by the JFET effect.

In the SiC vertical power MOSFET of FIG. 1, the concentration of the n type drift layer 2a is decreased to decrease Cds and Cdg. In the gap region between the opposing layers each consisting of the p channel region 3 and the high concentration p base region 4, the JFET resistance, which is included in the bottom row in the table of FIG. 7, is relatively high. The high resistance could be avoided by expanding the gap between the adjacent layers each including the p channel region 3 and the high concentration p base region 4. This measure, however, decreases a channel density and increases a channel resistance. Accordingly, in Embodiment Example 2, the length of the gap region is unchanged and the concentration of this region is increased to form the high concentration n type region 11 with a concentration higher than that in the n type drift layer 2a. While the high concentration of the relatively high concentration n type region 11 increases the drain-gate junction capacitance Cdg, the high concentration n type region 11 becomes depleted at a very low voltage with a depletion layer extending from the high concentration p base region 4 in FIG. 1. As a consequence, the loss determined by (½) C V² is not much affected.

An advantage of Embodiment Example 2 is the possibility of suppressing the increase in ON resistance involved in the JFET effect in addition to the advantage of Embodiment Example 1, that is, significant reduction in the drain-source junction capacitance Cds and the drain-gate junction capacitance Cdg and resulting reduction in the output capacitance Coss, which is the sum of the capacitances Cds and Cdg, with a penalty of slight increase in the ON resistance.

Embodiment Example 3

Figure 3:
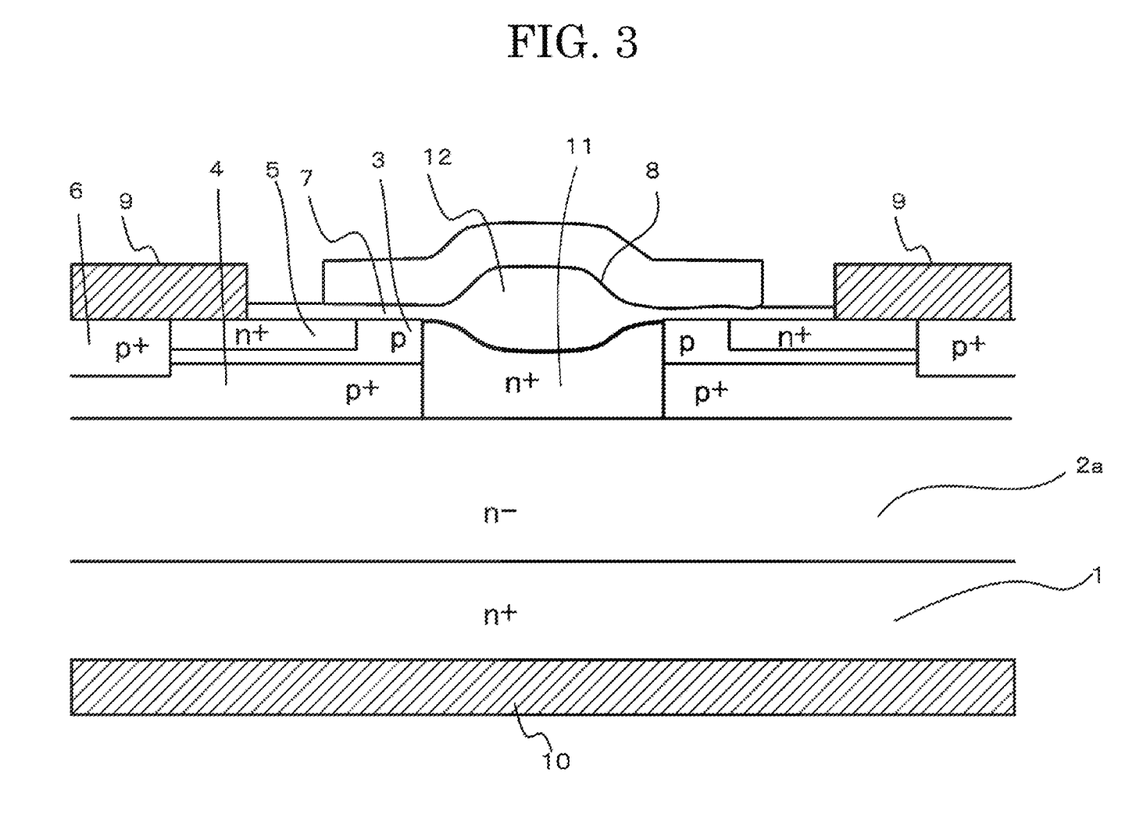
FIG. 3 is a schematic sectional view of a part of an SiC vertical power MOSFET according to Embodiment Example 3 of the present invention.

FIG. 3 is a sectional view of a part of an SiC vertical power MOSFET according to Embodiment Example 3 of the present invention. The SiC vertical power MOSFET of FIG. 3 differs from the device of Embodiment Example 2 shown in FIG. 2 in that a terrace gate region 12 is formed in a portion of the gate oxide film 7 on the surface of the relatively high concentration n type region 11 disposed in the gap region between the opposing layers each including the p channel region 3 and the high concentration p base region 4. The increased thickness of the portion of the gate oxide film 7 decreases the oxide film capacitance Cdgo (indicated in FIG. 6A) of the structure sandwiching the gate oxide film 7 just beneath the polysilicon gate electrode 8. The reduction in the capacitance Cdgo results in reduction in the drain-gate junction capacitance Cdg. In Embodiment Example 3, the output capacitance Coss is the sum of the capacitances Cdg and Cds. The terrace gate region 12 formed of a thick film to reduce the capacitance Cdgo leads to a situation in which the electric potential just beneath the terrace gate region 12 increases at a low drain voltage and an electric current to charge the junction capacitances between the relatively high concentration n type region 11 and the p channel region 3 and between the region 11 and the high concentration p base region 4. As a result, although an effect to reduce the output capacitance Coss is insignificant, the drain-gate junction capacitance Cdg decreases, which suppresses generation of the oscillation due to feedback of the drain voltage variation onto the gate voltage. Since an SiC vertical power MOSFET exhibits high breakdown electric field strength, a concentration in the low concentration n type drift layer 2a can be higher than that in a Si device. In the device of FIG. 1, the gate oxide film 7 is subjected to a high voltage with shared voltages of the depletion layer capacitance Cdgd and the gate oxide film capacitance Cdgo. This tends to degrade reliability of the gate oxide film 7. The device of Embodiment Example 3, in contrast, prevents the degradation of reliability of the gage oxide film, which is another advantage of Embodiment Example 3.

If the thick terrace gate region 12 is formed in a shape having an abrupt step, an electric field would be concentrated at the step part. Thus, the terrace gate region 12 may be formed to have a gentle slope as shown in FIG. 3. Such a shape can be formed by a well-known process of so-called LOCOS process.

Whereas Embodiment Example 3 in the above description has a relatively high concentration n type region 11 for reducing the resistance due to the JFET effect, the same advantages can be of course obtained in structures without the relatively high concentration n type region 11.

Embodiment Example 4

Figure 8:
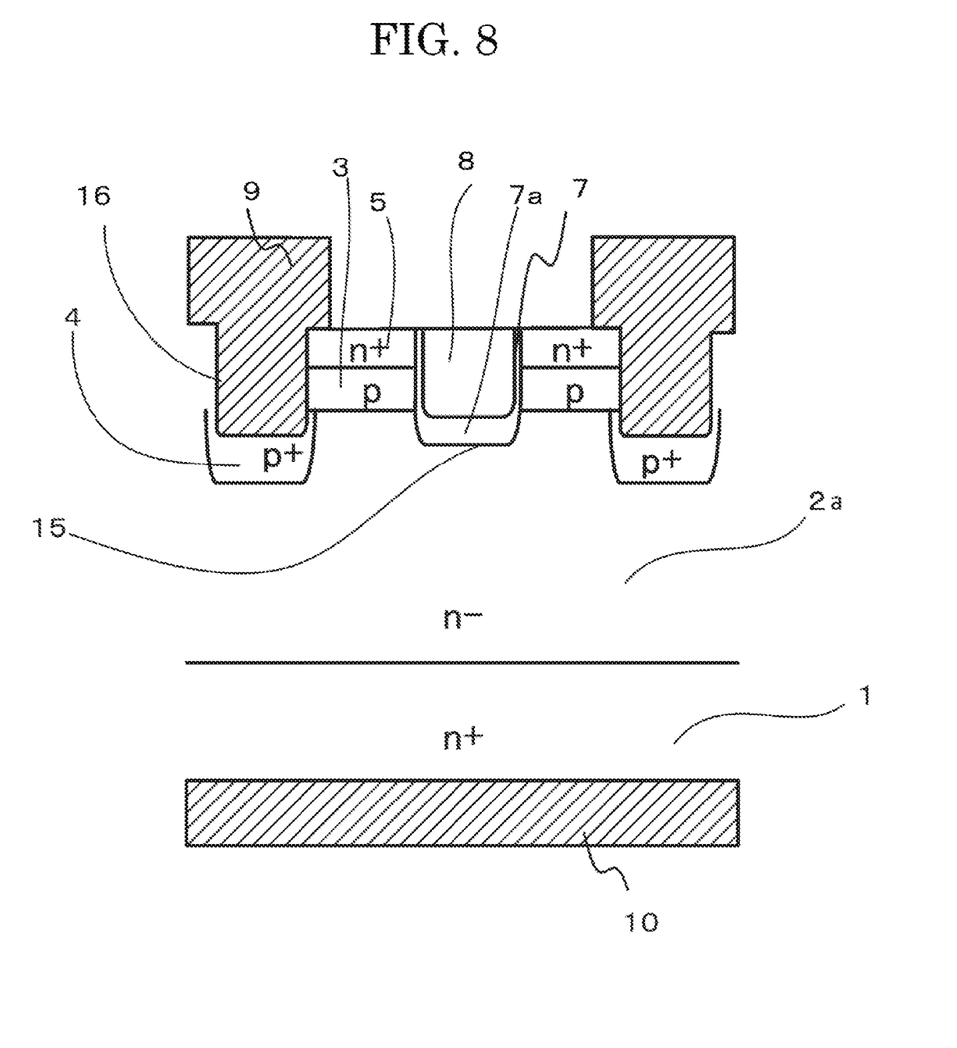
FIG. 8 is a schematic sectional views of a part of an SiC vertical power MOSFET according to Embodiment Example 4 of the present invention showing a double-trench structure in a device of the MOSFET.
Figure 9:
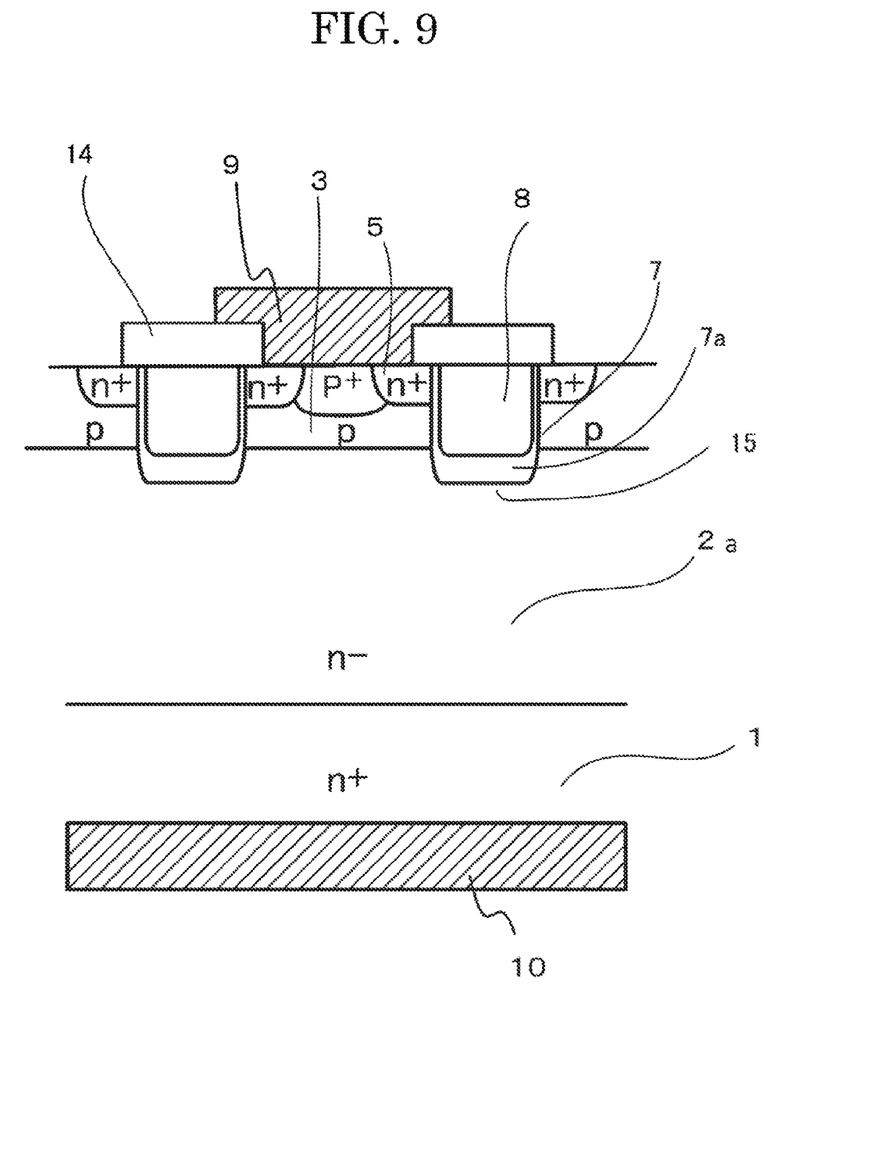
FIG. 9 is schematic sectional views of a part of an SiC vertical power MOSFET according to Embodiment Example 4 of the present invention showing a trench structure in a device of the MOSFET.

FIG. 8 is a sectional view of a part of an SiC vertical power MOSFET according to Embodiment Example 4 of the present invention. The device of Embodiment Example 4 shown in FIG. 8 differs from the devices of Embodiment Examples 1, 2, and 3 shown in FIGS. 1, 2, and 3 in that while the devices of FIGS. 1, 2, and 3 have a planar gate structure, the device of Embodiment Example 4 of FIG. 8 has a double trench structure that includes recessed parts both at a source region 5 and at a gate electrode 8 in the surface region of the substrate as shown in FIG. 8. A usual trench structure as shown in FIG. 9 has only one type of trench gate structure with a gate electrode 8 embedded in a gate trench 15 through a gate oxide film 7. By applying a voltage higher than a threshold value onto the gate electrode 8 through the gate oxide film 7, an inversion layer is induced in the surface region of the SiC substrate at the side of the trench. Such a trench gate structure reduces a cell pitch and increases a total channel width, reducing the contribution of channel resistance. As a result, a fraction of the channel resistance and the JFET resistance per total ON resistance of the device is decreased.

The trench structure of FIG. 9, however, has a disadvantage in that it has a complicated structure and needs many production steps, increasing manufacturing cost, and a disadvantage in that the gate oxide film is subjected to an extremely high electric field strength because pinch-off by a JFET cannot be utilized, which significantly degrades reliability of the oxide film. Accordingly, the SiC vertical power MOSFET according to Embodiment Example 4 of FIG. 8 comprises not only the gate trench 15, but also, a source trench 16 is formed in the source region 5, and the high concentration p base region 4 is formed from the source trench 16 by ion implantation. The SiC vertical power MOSFET shown in FIG. 8 is characterized by providing the double trench structure in which pinch-off occurs with a depletion layer extending from the high density p base region 4. In addition, the device of Embodiment Example 4 as shown in FIG. 8 comprises a thick oxide film 7a at the bottom of the gate trench 15. While a trench gate structure can generally increase channel density relatively easily, it is rather difficult, as compared with the planar gate structure of FIG. 1, to relax a high electric field strength developed at the interface between the p channel region 3 and the low density n type drift layer 2a caused by the pinch-off. A channel length cannot be shortened too much or the channel region can readily punch-through. Moreover, a channel mobility decreases in a channel formed on the side surface of the trench. These situations hinder significant reduction in the channel resistance even though the channel density is enhanced in the structure of FIG. 9. As a result, the proportion of the resistance of the drift layer becomes about 30% of the total ON resistance. Thus, it is not advantageous to increase the resistance of the drift layer too much. Rather, in embodiments the contribution of the resistance of the drift layer is set to be in the range of 33% to 60% in order to confine the increase in the ON resistance within the same extent.

In addition to the Embodiment Example 4 described above, it is also advantageous and favorable for the trench gate structure shown in FIG. 9 to have a thick gate oxide film 7a at the bottom of the gate trench 15 and to have the concentration of the low concentration n type drift layer 2a set at a concentration in the range from 33% to 60% of the best concentration mentioned previously.

As described thus far, an SiC vertical power MOSFET according to any one of Embodiment Examples 1 through 4 decreases the capacitance components Cds and Cdg of the capacitance Coss in a high drain voltage range adversely affecting a switching loss, thereby reducing the energy loss. The device of the invention further suppresses malfunctioning such as generation of oscillation by making the drain voltage change due to the capacitance Cdg feed back to the gate voltage in a negligible amount.

While the present invention has been particularly shown and described with reference to certain specific embodiments, it will be understood by those skilled in the art that the foregoing and other changes in form and details can be made therein without departing from the spirit and scope of the present invention.

DESCRIPTION OF SYMBOLS

1: high concentration n type semiconductor substrate
2: low concentration n type drift layer
3: p channel region
4: high concentration p base region
5: n+ source region
6: p+ contact region
7: gate oxide film
8: poly-silicon gate electrode
9: source electrode
10: drain electrode
11: JFET effect reducing region
12: terrace gate region
13: pn junction
14: interlayer dielectric film
15: gate trench
16: source trench
20: depletion layer

What is claimed is:

1. A wide band gap semiconductor device comprising:
a wide band gap semiconductor substrate of a first conductivity type with a high impurity concentration;
a drift layer of the first conductivity type with a low impurity concentration composed of a wide band gap semiconductor material on the substrate;
a channel region of a second conductivity type selectively formed in a surface region of the drift layer;
a source region of the first conductivity type selectively arranged in a surface region of the channel region of the second conductivity type;
a source electrode in common contact with a surface of the source region and a surface of the channel region;
a plurality of gate trenches formed from a surface of the source region of the first conductivity type through the channel region reaching the drift layer; and
a gate electrode embedded in each of the gate trenches interposing a gate oxide film on an inner surface of the gate trench;
wherein an impurity concentration of the drift layer of the first conductivity type with a low impurity concentration composed of a wide band gap semiconductor material is in a range from 33% to 60% of an impurity concentration that is $1.3 \times 10^{16}$ cm$^{-3}$ in an element with a withstand voltage of 1200 V and $8.0 \times 10^{16}$ cm$^{-3}$ in an element with a withstand voltage 1700 V.

2. The wide band gap semiconductor device according to claim 1, wherein the gate oxide film is thicker on a bottom of the trench than on a side wall of the trench.

3. The wide band gap semiconductor device according to claim 1, wherein the wide band gap semiconductor material is selected from the group consisting of silicon carbide (SiC) semiconductor, gallium nitride (GaN) semiconductor, and diamond.

4. A wide band gap semiconductor device comprising:
a wide band gap semiconductor substrate of a first conductivity type with a high impurity concentration;
a drift layer of the first conductivity type with a low impurity concentration composed of a wide band gap semiconductor material on the substrate;
a channel region of a second conductivity type selectively formed in a surface region of the drift layer;
a source region of the first conductivity type selectively arranged in a surface region of the channel region of the second conductivity type;
a source electrode in common contact with a surface of the source region and a surface of the channel region;
a plurality of gate trenches and a plurality of source trenches, each of the gate trenches and the source trenches being formed from a surface of the source region of the first conductivity type through the channel region reaching the drift layer and being arranged alternately;
a gate electrode embedded in each of the gate trenches interposing a gate oxide film on an inner surface of the gate trench; and
a base region of the second conductivity type with a high impurity concentration disposed at a bottom of each of the source trenches;
wherein the source electrode that is in common contact with the base region and the source region both exposing to a side wall of the source trench is embedded in the source trench, and
wherein an impurity concentration of the drift layer of the first conductivity type with a low impurity concentration composed of a wide band gap semiconductor material is in a range from 33% to 60% of an impurity concentration that is $1.3 \times 10^{16}$ cm$^{-3}$ in an element with a withstand voltage of 1200 V and $8.0 \times 10^{16}$ cm$^{-3}$ in an element with a withstand voltage 1700 V.

5. The wide band gap semiconductor device according to claim 4, wherein the wide band gap semiconductor material is selected from the group consisting of silicon carbide (SiC) semiconductor, gallium nitride (GaN) semiconductor, and diamond.

* * * * *